United States Patent [19]

Jones

[11] 4,409,540
[45] Oct. 11, 1983

[54] ACTIVE VOLTAGE DIVIDER
[75] Inventor: Thaddeus M. Jones, Mishawaka, Ind.
[73] Assignee: Dresser Industries, Inc., Dallas, Tex.
[21] Appl. No.: 305,862
[22] Filed: Sep. 28, 1981
[51] Int. Cl.³ .............................................. H03H 1/00
[52] U.S. Cl. ........................... 323/369; 323/903; 55/105
[58] Field of Search .................. 55/105, 139; 323/369, 323/903; 330/298; 361/91

[56] References Cited

U.S. PATENT DOCUMENTS 3,679,989 7/1972 Thibodeau ..................... 330/298 X
3,745,749 7/1973 Gelfand .......................... 323/903 X
3,873,282 3/1975 Finch ............................. 323/903 X Primary Examiner—William M. Shoop
Attorney, Agent, or Firm—Daniel Rubin

[57] ABSTRACT

An active voltage divider providing output voltage overload protection operably effective in the event failure of the primary resistor should occur. Comprising the divider circuit is a differential amplifier operable as an integrator, a first pair of grounded diodes providing primary over-voltage protection for a first summing junction of the amplifier and a second pair of grounded diodes providing voltage backup protection for a second summing junction of the amplifier.

10 Claims, 5 Drawing Figures

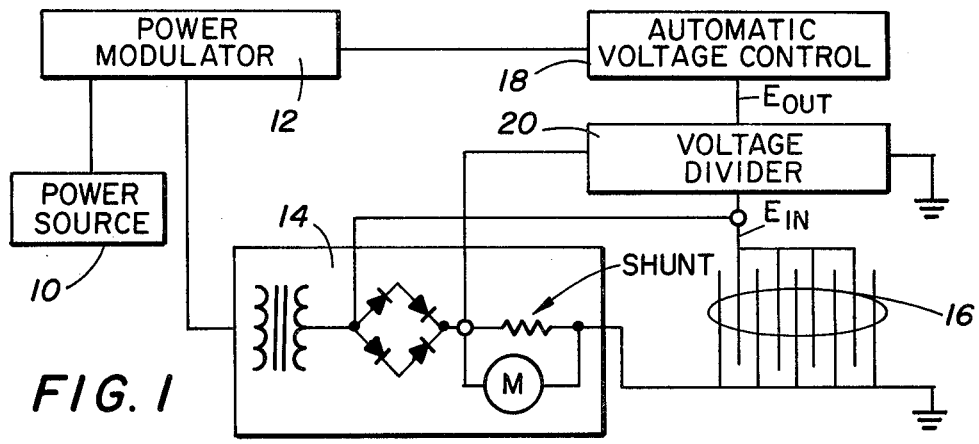
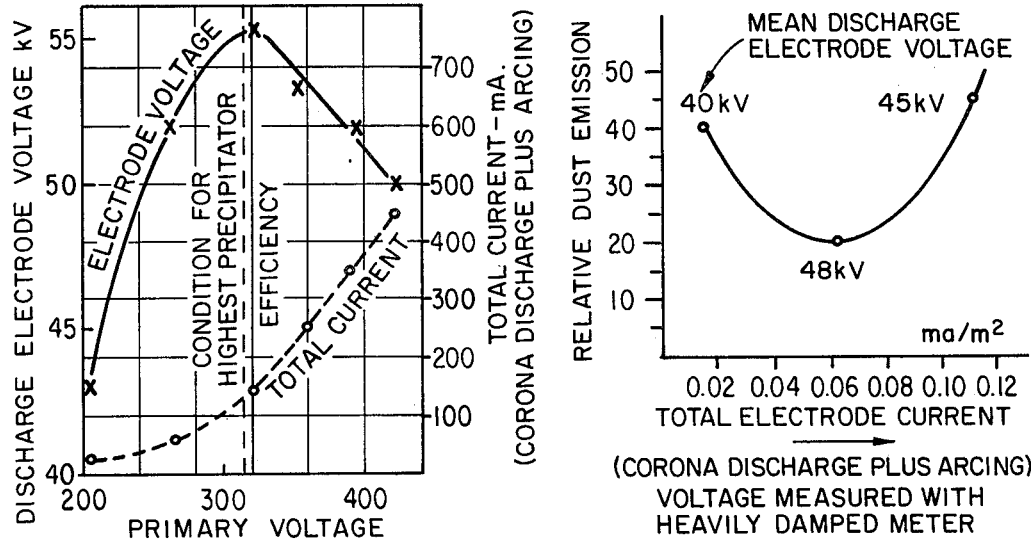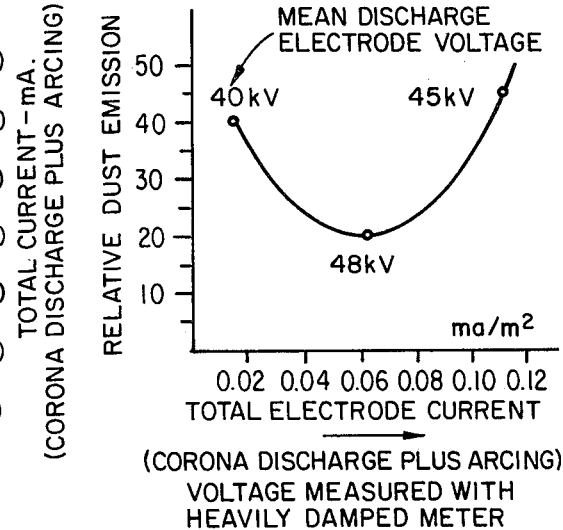
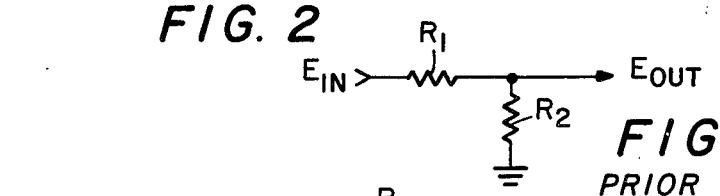
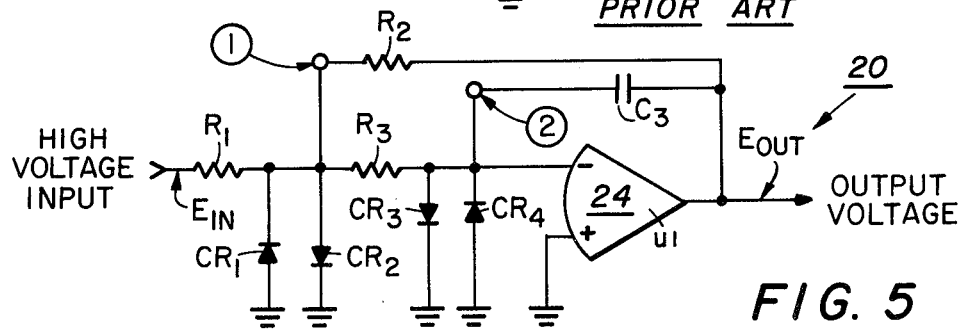

4,409,540

ACTIVE VOLTAGE DIVIDER

TECHNICAL FIELD

The field of art to which the invention pertains comprises the art of electricity, voltage magnitude and phase control systems.

BACKGROUND OF THE INVENTION

Voltage dividers are commonly installed across a comparatively high voltage source and tapped to afford availability of a fixed or variable fraction of the applied voltage. Typical passive voltage dividers of the prior art commonly utilize a resistor of high meg-ohm value calculated to produce the required voltage drop. Characteristically, such resistors are subject to stress effects which after many hours of use tend to decrease the original resistance value of the resistor to a nominal fraction thereof. When such resistor failure occurs, the output voltage of the divider increasingly approaches the value of the input voltage thereby defeating the purpose for which the voltage divider was provided. As can be appreciated, the foregoing can cause catastrophic failure of any peripheral devices which depend on a low voltage input from the voltage divider along with the interconnecting wire thereto.

One approach for contending with the above has been to provide a backup shunt circuit with protective components able to dissipate large amounts of power. To be effective, such components must be oversized, and by virtue of the leakage resistance and currents associated therewith the components are temperature sensitive as to render the attenuation factor of the voltage divider both temperature sensitive and unpredictable.

Despite recognition of the foregoing, a ready solution therefor has not previously been known.

SUMMARY OF THE INVENTION

The invention relates to an active voltage divider and more specifically to an active voltage divider able to afford overload protection in the event failure of the primary resistor should occur. In a preferred embodiment the active voltage divider hereof is utilized in an electrostatic precipitator for providing a reduced voltage level to the automatic voltage controller therefor.

The foregoing is achieved in accordance with the invention by utilizing a differential amplifier connected as a conventional integrator, along with a first pair of grounded diodes providing overvoltage protection for a first summing junction of the amplifier and a second pair of grounded diodes providing overvoltage protection for a second summing junction of the amplifier. By selecting the diodes with current ratings large enough to sustain any set of potential failure conditions, overload protection is afforded while by virtue of being grounded, the leakage current and resistance thereof do not have any significant effect on operational accuracy of the divider output.

It is therefore an object of the invention to afford a novel active voltage divider able to prevent overload in the event failure of the primary resistor should occur.

It is further object of the invention to effect the foregoing object in a reliable and inexpensive manner.

DESCRIPTION OF THE DRAWINGS

FIG. 1 is a block diagram of an electrostatic precipitator apparatus employing the voltage divider of the invention;

FIG. 2 is a graph illustrating electrical characteristics of an electrostatic precipitator;

FIG. 3 is a graph illustrating variation of dust emission with applied voltage and current of an electrostatic precipitator;

FIG. 4 is an electrical diagram of a prior art passive voltage divider; and

FIG. 5 is an electrical circuit diagram for the active voltage divider of the invention.

Referring first to FIGS. 1–3, there is disclosed a more or less standard operating circuit for an electrostatic precipitator in which an A.C. power source 10, via a power modulator 12, is connected to a high voltage transformer rectifier 14 of a commercially available type for energizing precipitator electrodes 16 to high voltages on the order of 30 KV to 75 KV. The electrodes are typically secured in spaced apart relation vertically extending in a well known manner transversely to the direction of air flow from which dust is to be removed. The electrical load applied to electrodes 16 is under control of automatic voltage controller 18 being supplied with reduced voltage by voltage divider 20 in accordance with the invention hereof, as well be described below. Power modulator 12 functions to vary the input to rectifier 14 in order to afford a mean value of voltage on the electrodes at the highest possible value at which maximum cleaning efficiency occurs, pursuant to commands from A.V. controller 18. (See FIGS. 2 and 3).

For appreciation of the invention, reference is made first to the prior art voltage divider circuit of FIG. 4 in which the voltage drop of the input voltage $E_{in}$ is afforded by a resistor $R_1$ having a high meg-ohm resistance. It can be appreciated that such resistors are characteristically subject to in-service stress which after many hours of use can cause failure of the resistor to occur. Failure typically reduces the resistance value of $R_1$ to a small percentage of its nominal value, thus causing the voltage value of $E_{out}$ to increasingly approach the high voltage input of $E_{in}$. As previously noted supra, this situation can cause catastrophic failure of any peripheral devices connected to the voltage divider along with the interconnecting wire, and for the embodiment being described would render automatic voltage controller 18 inoperable.

In contrast with the prior art, the voltage divider hereof as disclosed in FIG. 5 typically receives voltage $E_{in}$ from transformer rectifier 14 at a voltage on the order of about 55 KV for providing a reduced voltage $E_{out}$ to automatic voltage controller 18 of on the order of about 5 volts. Comprising the circuit thereof is a primary resistor $R_1$ of high meg-ohm value corresponding to the resistor $R_1$ in the prior art construction of FIG. 4. Included therewith is a general purpose differential operational amplifier 24 operated as a conventional integrator. An input resistance $R_3$ and a feedback capacitor $C_3$ determine the gain-bandwidth product thereof and enable dynamic response of the circuit to be changed as needed for any specific application.

Grounded diodes $CR_1$ and $CR_2$ provide overvoltage protection for the summing junction designated 1, while grounded diodes $CR_3$ and $CR_4$ serve to prevent the summing junction designated 2 of amplifier 24 from being exposed to any destructive voltage, as will be further explained. Since each of the summing junctions are at virtual ground, leakage currents through the associated diodes have little effect if any, on circuit accuracy, while resistor $R_3$ limits the current flowing through diodes $CR_3$ and $CR_4$ to a safe value. Resistors $R_1$ and $R_2$ set the D.C. gain of the divider.

Diodes $CR_1$ and $CR_2$ can be selected with current ratings large enough to sustain any set of fault conditions, and by virtue of being grounded the leakage current and resistancethereof do not have any significant affect on accuracy of the divider circuit. When these diodes are silicon units and forward biased, the voltage drop of either will usually not exceed 1.5 volts. Since the turn-on time of a silicon diode is normally in the range of one to two microseconds, its response is faster than gas quenched spark gaps. Any peak let-through voltage under turn-on conditions is quite small such that during a turn-on condition, diodes $CR_3$ and $CR_4$ provide additional backup protection.

By the above description there is disclosed a novel active voltage divider able to eliminate the prior difficulties associated with resistance failure in the passive voltage divider circuits of the prior art. By a simple and relatively inexpensive construction the potential adverse effects on peripheral equipment associated with prior art voltage dividers is substantially if not completely eliminated, thereby rendering the entire system more reliable and less costly to maintain. Where the active voltage divider of the invention is utilized with a transformer-rectifier such as unit 14 in the embodiment being described, failure of $R_1$ as a short circuit will trip the circuit breaker of the transformer-rectifier within a fraction of a second. Partial failure of $R_1$ could produce a sustained current of up to about two amps. Through diode $CR_1$ and $CR_2$ without producing a power line current high enough to trip the protective breaker. In the latter instance, the maximum power dissipated by the conducting semi-conductor diode will usually not exceed three watts, which can be conveniently dissipated and thereby insure against component failure elsewhere.

Since many changes could be made in the above construction, and many apparently widely different embodiments of this invention could be made without departing from the scope thereof, it is intended that all matter contained in the drawings and specification shall be interpreted as illustrative and not in a limiting sense.

The embodiments of the invention in which an exclusive property or privilege is claimed are defined as follows:

1. In a voltage divider circuit adapted to receive an input voltage and including a high resistance primary resistor providing a voltage drop for effecting a selected low output voltage, overload protection means operably effective on failure of said resistor to restrict increases in said output voltage, said overload protection means comprising differential amplifier means affording integrating operation and diode means effective to prevent excess voltage from being applied to summing junctions of said amplifier means.

2. In a voltage divider circuit according to claim 1 in which said diode means comprises a first pair of diodes affording overvoltage protection to a first summing junction and second pair of diodes affording overvoltage protection to a second summing junction.

3. In a voltage divider circuit according to claim 2 in which said diode pairs are each connected to ground.

4. In a voltage divider circuit according to claims 2 or 3 including a secondary resistor connected between said diode pairs for limiting the current value through said second pair of diodes.

5. In a voltage divider circuit according to claim 4 including a feedback capacitor operably effective in conjunction with said secondary resistor for determining the dynamic response of the circuit.

6. In an electrostatic precipitator including discharge electrodes adapted for charging dust particles in a passing airstream, and power means for energizing said electrodes to a high voltage value, including a voltage controller adapted to control the input voltage to said electrodes, a voltage divider circuit for supplying a reduced value of voltage to said controller and comprising a high resistance primary resistor providing a voltage drop for effecting a selected low output voltage and overload protection means operably effective on failure of said resistor to restrict increases in said output voltage, said overload protection means comprising differential amplifier means affording integrating operation and diode means effective to prevent excess voltage from being applied to summing junctions of said amplifier means.

7. In an electrostatic precipitator according to claim 6 in which said diode means comprises a first pair of diodes affording overvoltage protection to a first summing junction and a second pair of diodes affording overvoltage protection to a second summing junction.

8. In an electrostatic precipitator according to claim 7 in which said diode pairs are each connected to ground.

9. In an electrostatic precipitator according to claims 7 or 8, including a secondary resistor connected between said diode pairs for limiting the current value through said second pair of diodes.

10. In an electrostatic precipitator according to claim 9, including a feedback capacitor operably effective in conjunction with said secondary resistor for determining the dynamic response of the voltage divider circuit.

* * * * *